United States Patent
Shen

(10) Patent No.: US 9,048,817 B2
(45) Date of Patent: Jun. 2, 2015

(54) VOLTAGE FED FEED FORWARD ACTIVE EMI FILTER

(71) Applicant: HAMILTON SUNDSTRAND CORPORATION, Charlotte, NC (US)

(72) Inventor: Miaosen Shen, Vernon, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 14/162,080

(22) Filed: Jan. 23, 2014

(65) Prior Publication Data

US 2014/0292401 A1 Oct. 2, 2014

Related U.S. Application Data

(63) Continuation-in-part of application No. 13/853,229, filed on Mar. 29, 2013, now Pat. No. 8,823,448.

(60) Provisional application No. 61/865,740, filed on Aug. 14, 2013.

(51) Int. Cl.
| | |
|---|---|
| H03B 1/00 | (2006.01) |
| H03H 11/12 | (2006.01) |
| H02M 1/44 | (2007.01) |
| H02M 1/15 | (2006.01) |
| H03H 11/04 | (2006.01) |

(52) U.S. Cl.
CPC ......... *H03H 11/1217* (2013.01); *H03H 11/126* (2013.01); *H02M 1/44* (2013.01); *H03H 2011/0477* (2013.01); *H03H 2011/0488* (2013.01); *H02M 1/15* (2013.01)

(58) Field of Classification Search
CPC ................................ H04B 15/00; H04B 15/02
USPC .......................... 327/551, 552, 556, 559, 561
See application file for complete search history.

(56) References Cited

U.S. PATENT DOCUMENTS

| | | | |
|---|---|---|---|
| 7,266,062 B2 | 9/2007 | Kurihara | |
| 7,583,136 B2 | 9/2009 | Pelly | |
| 7,944,326 B2 | 5/2011 | Tucker | |
| 8,358,170 B2 * | 1/2013 | Chen et al. | 330/151 |

OTHER PUBLICATIONS

Notice of Allowance dated May 1, 2014 in U.S. Appl. No. 13/853,229.
Ex Parte Quayle Action dated Mar. 27, 2014 in U.S. Appl. No. 13/853,229.

* cited by examiner

*Primary Examiner* — Jeffrey Zweizig
(74) *Attorney, Agent, or Firm* — Snell & Wilmer L.L.P.

(57) ABSTRACT

An apparatus for active feed forward electromagnetic interference (EMI) filtering, including, a noise detection and current reconstruction circuit that receives EMI noise occurring at a noise source, and noise voltage compensation circuit operatively coupled to the noise detection and current reconstruction circuits. The active feed forward circuit generates a noise voltage compensation signal based on the EMI noise reconstructed by the noise detection circuit.

14 Claims, 14 Drawing Sheets

-- PRIOR ART --

-- PRIOR ART --

-- PRIOR ART --

VOLTAGE FED FEED FORWARD ACTIVE EMI FILTER

CROSS-REFERENCE TO RELATED APPLICATIONS

This application is a nonprovisional of and claims priority to and the benefit of U.S. Provisional Application No. 61/865,740, entitled "VOLTAGE FED FEED FORWARD ACTIVE EMI FILTER," filed on Aug. 14, 2013, which is hereby incorporated by reference in its entirety.

FIELD

The present disclosure relates to electromagnetic interference (EMI) attenuation in power conversion systems, and more particularly, to common-mode EMI attenuation for three-phase inverter based motor drive applications.

BACKGROUND

Conventional power inverters (such as three phase inverters) are widely used in various industrial applications that include, for example, motor drives, power grids, uninterruptible power supplies, etc. At the heart of these conventional inverters is a semiconductor device (e.g., a metal-oxide semiconductor field-effect transistor ("MOSFET"), an Insulated Gate Bipolar Transistor ("IGBT"), and the like). Typically, these semiconductor devices operate in a high speed switching mode at a certain frequencies, e.g., pulse-width modulation ("PWM"). High-speed switching of such semiconductor devices can improve power quality for the overall inverter and a size reduction of its respective input and output filter. However, the high speed switching of the semiconductor device can create electromagnetic interference ("EMI"), which can deteriorate equipment performance near the inverter.

EMI is a disturbance that may affect an electrical circuit due to electromagnetic induction and/or electromagnetic radiation emitted from an external source. The disturbance may interrupt, obstruct, or otherwise degrade or limit the effective performance of the circuit.

SUMMARY

The present disclosure relates to EMI attenuation in power conversion systems, and more particularly, to common-mode EMI attenuation for three-phase inverter based motor drive applications. An apparatus and/or method for active feed forward electromagnetic interference (EMI) filtering is disclosed herein. The apparatus comprises a noise voltage detection circuit for receiving EMI noise occurring at a noise source. The apparatus comprises a current reconstruction circuit for reconstructing current associated with EMI noise occurring at a noise source. The apparatus comprises an active feed forward circuit operatively coupled to the noise detection circuit to generate a voltage noise compensation signal based on EMI noise received by the noise detection circuit. The apparatus comprises a filter operatively coupled to the active feed forward circuit and the noise source. The filter is configured to receive the EMI noise occurring at the noise source and the voltage noise compensation signal from the active feed forward circuit. The filter is configured to cancel received EMI noise with the received voltage noise compensation signal to reduce EMI noise at a load.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the disclosure, it should be understood that other embodiments may be realized and that logical changes may be made without departing from the spirit and scope of the disclosure. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step.

Certain industries have strict EMI standards or restrictions for the application of PWM controlled inverters. For instance, common-mode EMI noise may be categorized into conducted type in 150 kHz to 30 MHz and radiated type beyond 30 MHz. Common-mode EMI noise may be the conducted type, which comprises various EMI standards and specifications. For the three-phase inverter, the use of higher switching frequency facilitates power quality and power density, but may lead to increased EMI noise. For example, the EMI noise level at certain frequencies is increased by 20 dB if the switching frequency is increased by 10 times. Thus, EMI issues may be a limiting factor for the design of high frequency and high power density inverter. Due to EMI requirements, a passive EMI filter is usually adopted between inverter and load and/or between DC power supply and inverter. Generally, the passive filter employs common-mode choke (inductor) and capacitor to form a typical L-C filter with low-pass characteristic shown in FIG. 1.

Figure 1:
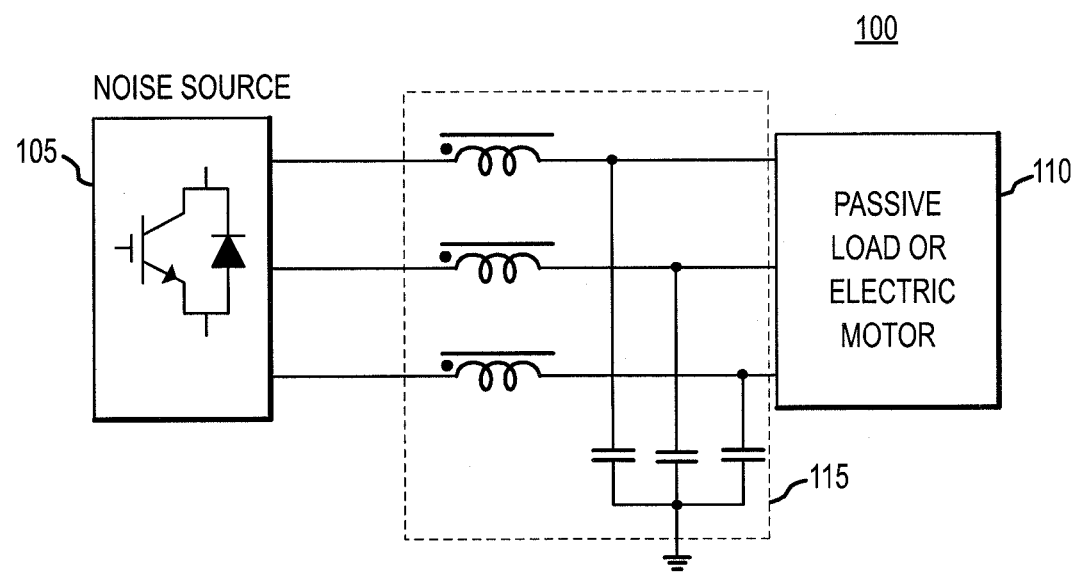
FIG. 1 is a representative AC side common mode filter circuit schematic in accordance with various embodiments.

With continued reference to FIG. 1 and in accordance with various embodiments, a circuit diagram (e.g., circuit 100) comprising a noise source 105 coupled to a load 110 having an EMI filter 115 disposed there-between is depicted. In particular, noise source 105 can be an alternating current (AC) noise source connected to load 110, which can include a passive load, an electric motor, or the power grid, etc.

In contrast to passive EMI filters such as those shown in FIG. 1, active EMI filtering techniques can also be employed to attenuate EMI noise. Stated another way, active EMI filters may be used to reduce EMI noise, (e.g. using active circuits). FIGS. 2A-2D depict four feedback type active EMI filter circuit layouts, which sense the common mode noise at the load side and use high gain to inject a cancelling signal at the noise source side. The EMI filtering techniques shown in FIGS. 2A-2D may be configured to determine and/or sense common mode noise at a load side and use a high gain element (e.g., an operational amplifier) to introduce or inject a noise canceling signal at or near the noise source. Such active EMI filter techniques can be configured to reduce common mode noise by 10-20 dB from 150 kHz to 1 MHz. In this manner, such EMI filtering techniques shown in FIGS. 2A-2D may be configured to attenuate EMI noise in response to the EMI noise reaching respective loads (which EMI noise is also detected at such loads) and introduce or inject noise canceling signals at or near a noise source.

Figure 2A:
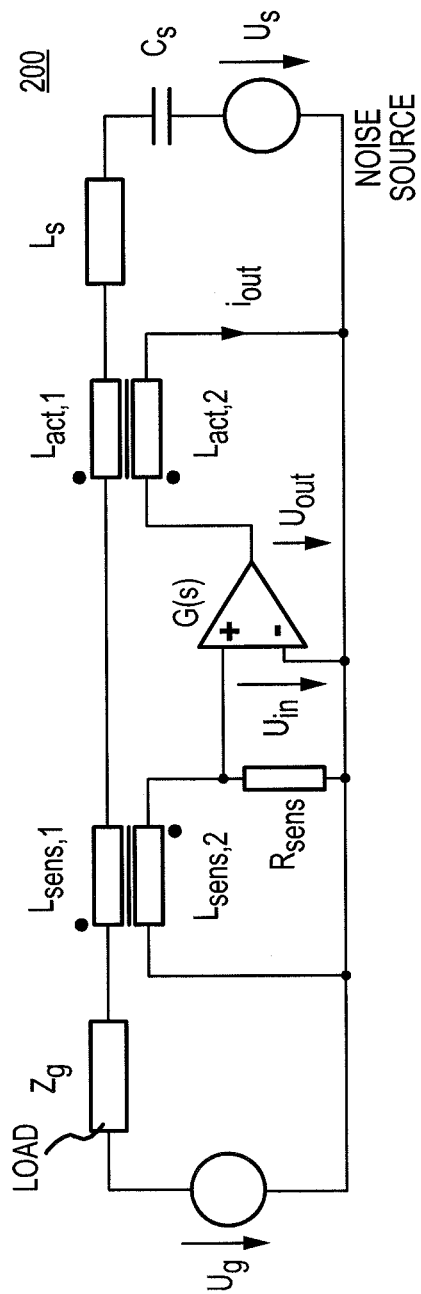
FIGS. 2a-2d are representative active EMI filter circuit diagrams in accordance with various embodiments.
Figure 2B:
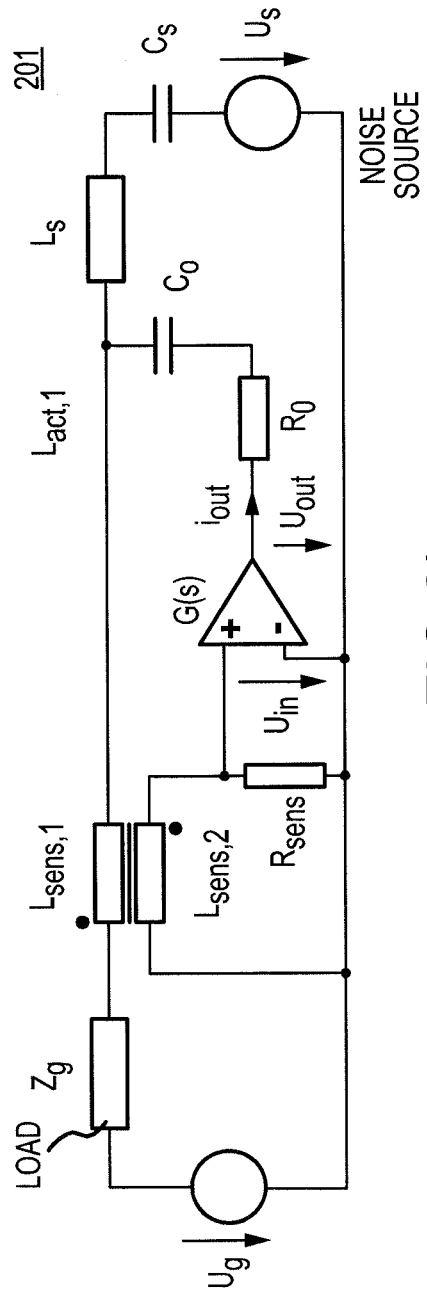
Figure 2C:
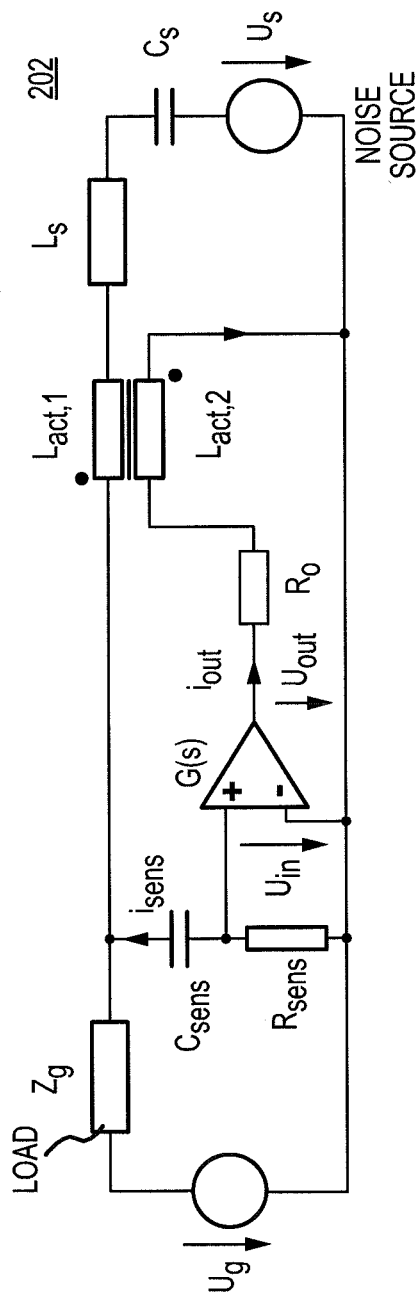
Figure 2D:
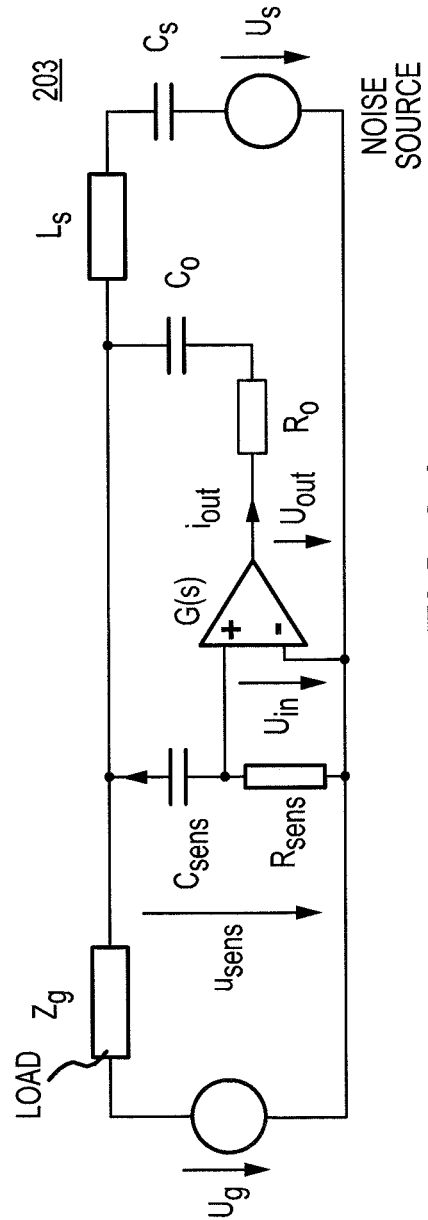

For instance, FIG. 2A depicts a circuit layout 200 utilizing current sensing voltage injection. FIG. 2B depicts a circuit layout 201 utilizing current sensing current injection. FIG. 2C depicts a circuit layout 202 utilizing voltage sensing voltage injection. FIG. 2D depicts a circuit layout 203 utilizing voltage sensing current injection.

Figure 3:
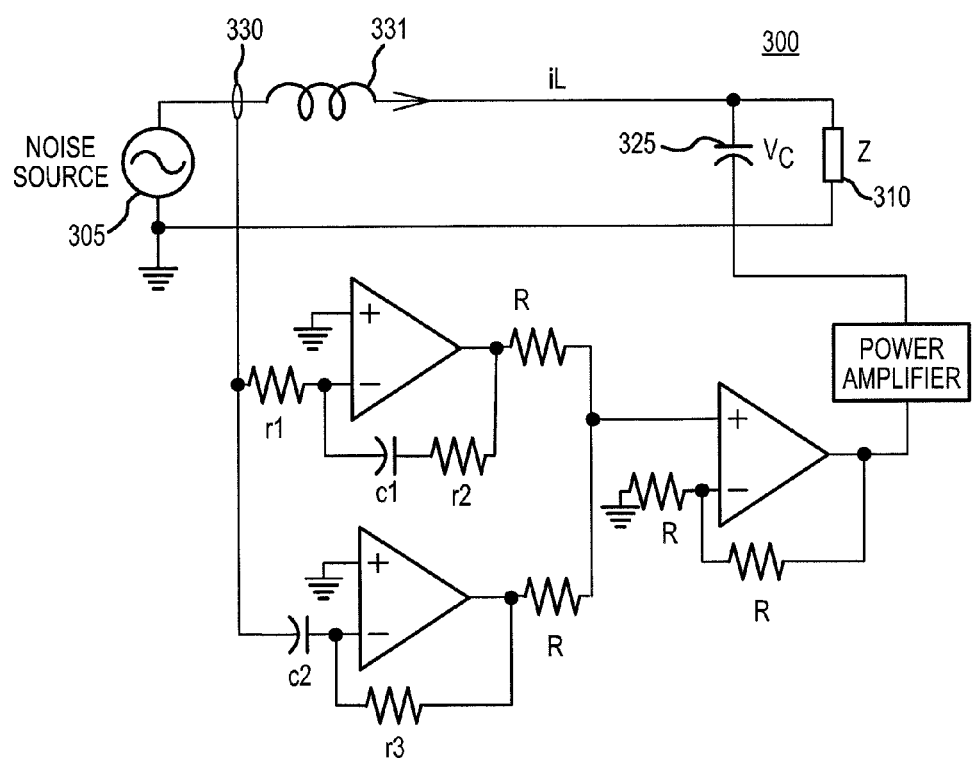
FIG. 3 depicts a representative current sensing feed forward active EMI filter circuit diagram in accordance with various embodiments.

According to various embodiments, and with reference to FIG. 3, a circuit layout comprising a feed forward active EMI filter is depicted. If possible, the noise level of a noise source is sensed by measuring/sensing the current at the source and providing a cancelling current through a capacitor coupling. In circuit 300, the noise current is directly sensed. Assuming the current is iL, and that the noise is completely absorbed by the filter capacitor C, the voltage generated by the noise current on the capacitor is Vc. A negative voltage is generated to cancel the noise voltage. In this way, substantially all of the noise current in input to the capacitor. Current sensing can be costly or not available in some instances.

Figure 4:
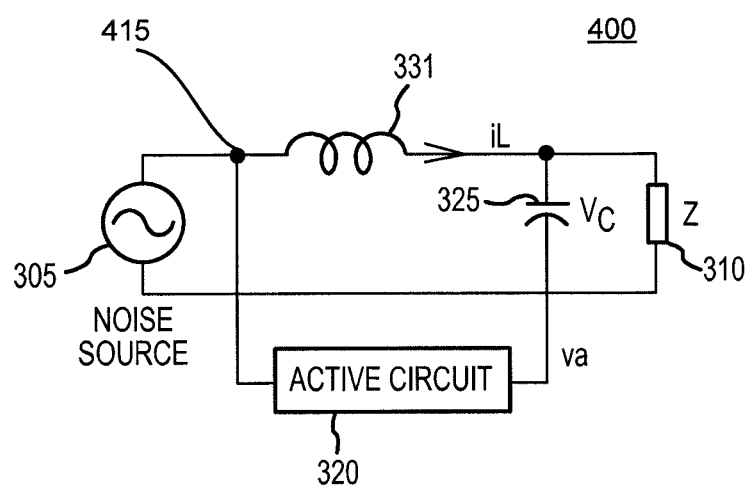
FIG. 4 depicts a representative voltage sensing feed forward EMI filter circuit diagram in accordance with various embodiments.

According to various embodiments, a voltage fed feed forward active EMI filter is shown in FIG. 4. FIG. 4 depicts a circuit 400 comprising a noise source 305 connected to a load 310 and having active feed forward sensor operatively coupled there-between. Active feed forward sensor and includes an active feed forward circuit 320 as well as a filter capacitor 325 and an inductor 331. Active feed forward circuit 320 may be configured to detect voltage originating from noise source 305, via a voltage sensor 415, and output a noise canceling signal (e.g., a voltage signal) to a terminal of capacitor 325 based on the sensed noise voltage. By sensing the noise voltage at the source side and assuming that the noise voltage is blocked, such as completely blocked, by the inductor, the noise current can be calculated by the noise voltage, which may be represented as:

$$i_L = \frac{v_{noise}}{sL}.$$ Equation 1

Figure 5:
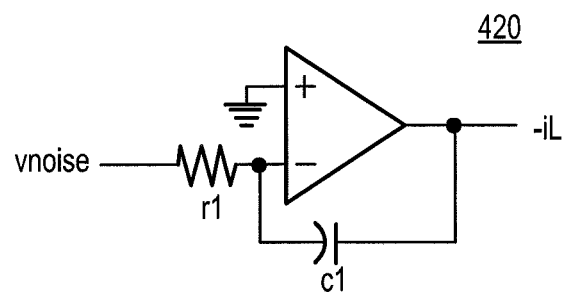
FIG. 5 depicts a representative noise current reconstruction circuit diagram in accordance with various embodiments.
Figure 6:
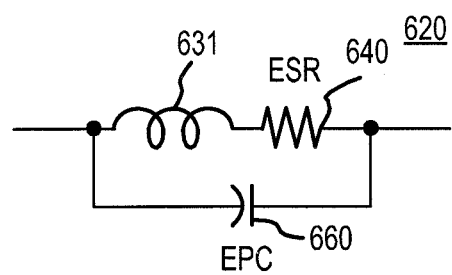
FIG. 6 depicts a representative circuit diagram comprising an inductor configuration in accordance with various embodiments.

Current $i_L$ can be reconstructed with an op amp circuit 420 as shown in FIG. 5. Often times, common mode inductors are not ideal. A simple model of an inductor can be represented as circuit 620 shown in FIG. 6 which depicts an equivalent inductor model. ESR 640 (equivalent series resistance) and EPC 660 (equivalent parallel capacitance) are depicted in FIG. 6. With the circuit of FIG. 6 in mind, the current through the inductor can be reconstructed with the circuit 700 shown in FIG. 7.

Figure 7:
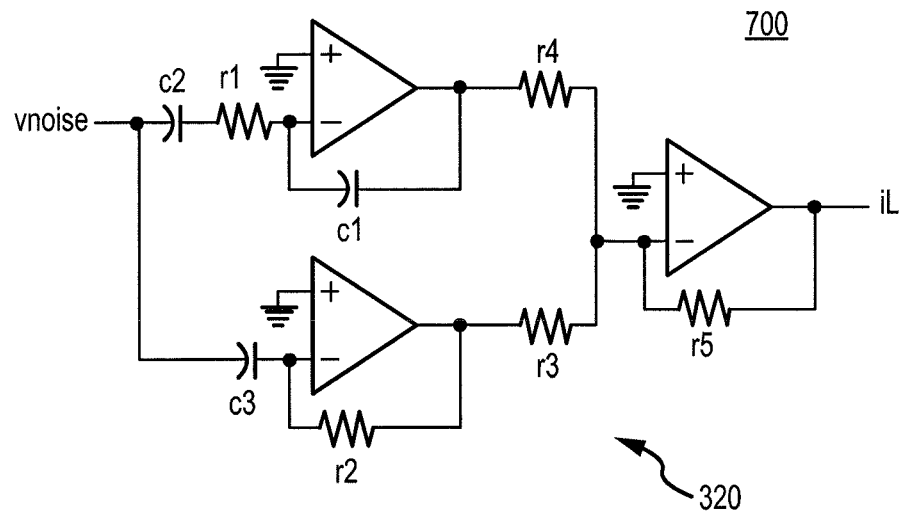
FIG. 7 depicts a representative current reconstruction circuit diagram when considering parasitic parameters in accordance with various embodiments.

With continued reference to FIG. 7, circuit 700 may be a current reconstruction circuit taking into account parasitic parameters. For instance, for circuit 700, the resultant current may be represented by:

$$i_L = v_{noise}\left(\frac{1}{\frac{c_1}{c_2} + sr_1c_1} + sr_2c_3\right)$$ Equation 2

In circuit 620, shown in FIG. 6, the current can be represented by:

$$i_L = v_{noise}\left(\frac{1}{sL + ESR} + sEPC\right)$$ Equation 3

Figure 8:
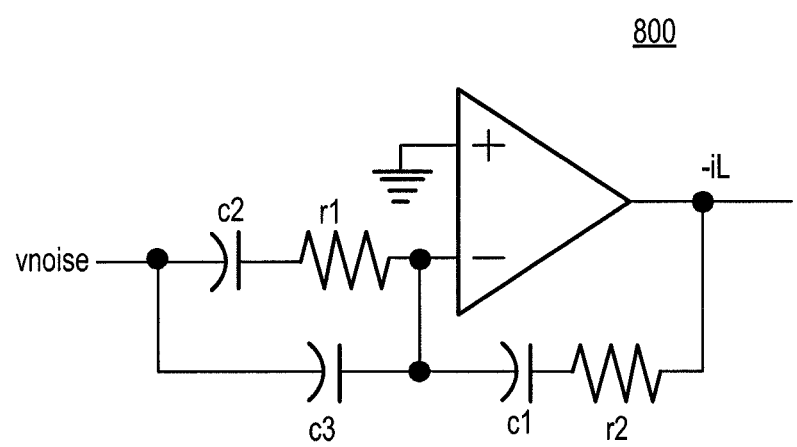
FIG. 8 depicts a representative current reconstruction circuit based on noise voltage comprising a complex RC network in accordance with various embodiments.

The two above two equations (equations 2 and 3) may be equalized to solve for c1, c2, c3, r1, and r2. There are also other methods to reconstruct the noise current from the noise voltage; one example is circuit 800 shown in FIG. 8, which implements a complex RC network. Based on this network, the transfer function may be solved and parameters may be selected to match the transfer function with the one shown above. There are more than one possible implementation of the current reconstruction circuit. In practical applications, the common mode inductance varies with frequency, so the parameters of the circuit should be measured and matched for a frequency range of interest, e.g. 150 kHz to 1 MHz. In response to determining/reconstructing current information associated with the noise source the circuit depicted in FIG. 3 may be utilized to actively cancel the noise. For additional information related to cancellation of a determined/sensed EMI noise for a noise source, please see U.S. application Ser. No. 13/853,229 entitled "FEED FORWARD ACTIVE EMI FILTER" filed on Mar. 29, 2013 which is hereby incorporated by reference in its entirety for all purposes. According to various embodiments, active current sensing of a noise source is not utilized herein.

The noise canceling signal can, in part, be an inverted noise signal to cancel across filter capacitor 325, as discussed herein (See FIG. 3). Filter capacitor 325 may be configured to receive and absorb noise current from noise source 305 as well as receive and absorb the noise canceling signal from active feed forward circuit (see FIG. 9B, e.g. circuit 901)

reducing, eliminating, and/or attenuating the conducted EMI from noise source 305 to load 310.

Filter capacitor 325 is configured to absorb the noise current from noise source 305 (which is the same as the noise current ($i_L$) through the inductor 320). Assuming capacitor 325 is an ideal capacitor, the voltage across the capacitor due to the noise current may be represented as:

$$v_c = \frac{1}{C}\int i_L dt \qquad \text{Equation 4}$$

To absorb substantially all of the noise signal current at filter capacitor 325 and to fully attenuate the noise level at load 310, an output voltage from filter capacitor 325 should be configured to be steady or zero. Therefore, the noise canceling signal received at one terminal of capacitor 325 (e.g., the output voltage from active feed forward sensor 320) should cancel the noise signal current or the voltage ripple across filter capacitor 325 received at its other terminal. For example, the noise canceling signal from active feed forward sensor 320 may be represented as:

$$v_a = -v_c = -\frac{1}{C}\int i_L dt \qquad \text{Equation 5}$$

However, if capacitor 325 is a non-ideal capacitor, an equivalent series resistance (ESR) and equivalent series inductance (ESL) is also present. A complete representation of the voltage across a non-deal capacitor can be represented as:

$$v_c = \frac{1}{C}\int i_L dt + ESR * i_L + ESL\frac{di_L}{dt} \qquad \text{Equation 6}$$

Accordingly, active feed forward sensor 320 should generate a complete noise canceling signal that accommodates the non-ideal ESR and ESL of capacitor 325. A resultant noise canceling circuit can thus be represented as:

$$v_a = -v_c = -\frac{1}{C}\int i_L dt - ESR * i_L - ESL\frac{di_L}{dt} \qquad \text{Equation 7}$$

Figure 9B:
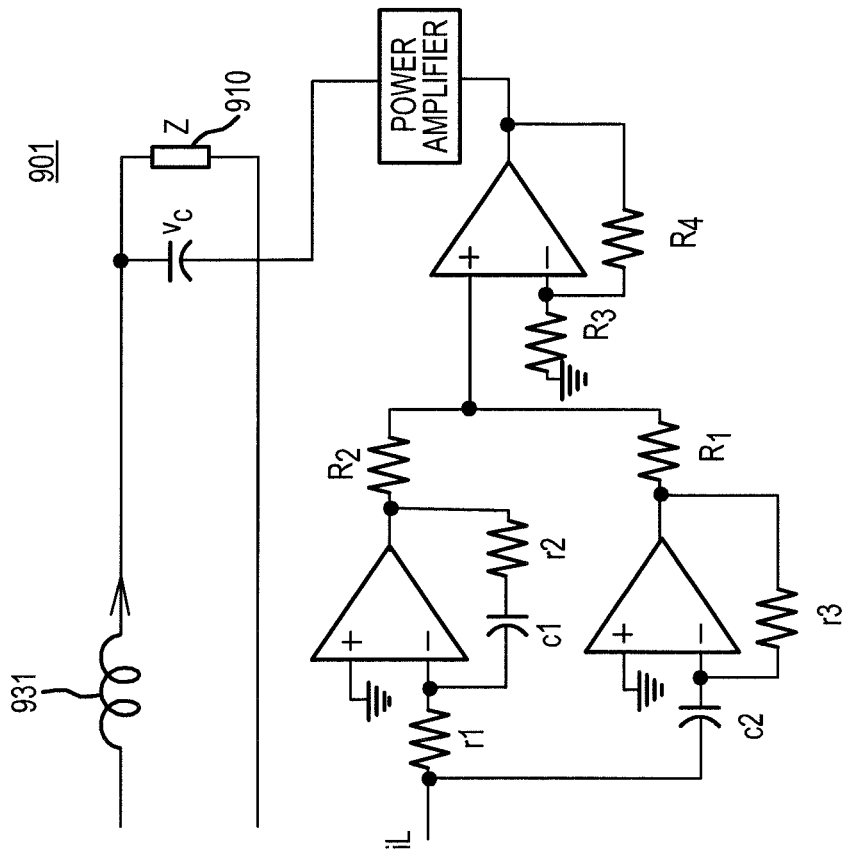
FIG. 9b depicts a compensation circuit comprising substantially complete compensation in accordance with various embodiments.
Figure 9A:
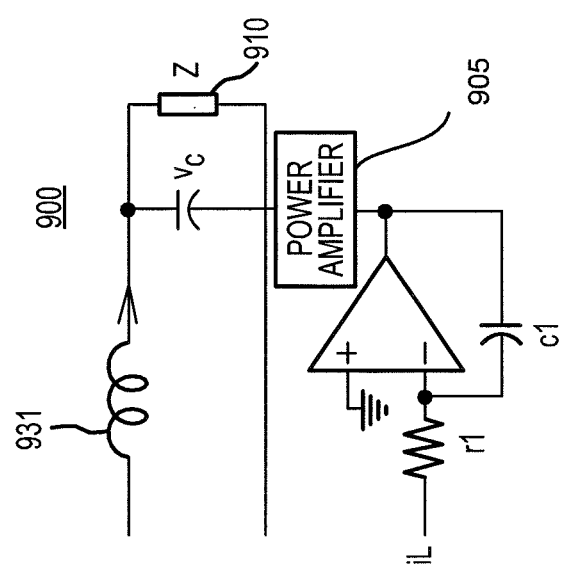
FIG. 9a depicts a compensation circuit comprising capacitor compensation in accordance with various embodiments.

Referring now to FIGS. 9A-9B circuit diagrams of various embodiments of an active feed forward sensor in accordance with this disclosure are shown, particularly implementing an ideal filter capacitor and a non-ideal filter capacitor, respectively. In particular, referring to FIG. 9A, a circuit 900 is shown including an active feed forward sensor having an active feed forward circuit, which can feed a noise canceling signal forward to filter capacitor to attenuate noise signals, as described above. Operatively, active feed forward circuit detects EMI noise from noise source (not shown) and generates a noise canceling signal based on the received EMI noise.

A power amplifier 905 receives the noise canceling signal from active feed forward circuit and amplifies or increases the noise canceling signal. Power amplifier 905 transmits the amplified noise canceling signal to filter capacitor. Notably, power amplifier 905 can include various circuitries for amplification (e.g., diodes, resistors, operational amplifiers, transistors, and the like). Ultimately, filter capacitor cancels the EMI noise received, at one terminal, from the noise source based on the noise canceling signal, which is received at a different terminal, thereby attenuating EMI noise and preventing or reducing such noise from reaching load 910. For example, when filter capacitor value is C, the circuit parameter shown can be represented as:

$$r_1 C_1 = C \qquad \text{Equation 8}$$

FIG. 9B illustrates a circuit 901 for the active feed forward sensor shown in FIG. 9A including a non-ideal filter capacitor implementation. In particular, FIG. 9B depicts additional circuitry of active feed forward sensor that can be configured to compensate for the ESR 640 and EPC 660 of a non-ideal filter capacitor, discussed above. When considering ESR 640 and EPC 660, the additional circuitry can be used to completely compensate the non-ideal filter capacitor with the following parameters:

$$r_1 C_1 = C \qquad \text{Equation 9}$$

$$\frac{r_1}{r_2} = ESR \qquad \text{Equation 10}$$

$$C_2 r_3 = ESL \qquad \text{Equation 11}$$

Figure 10:
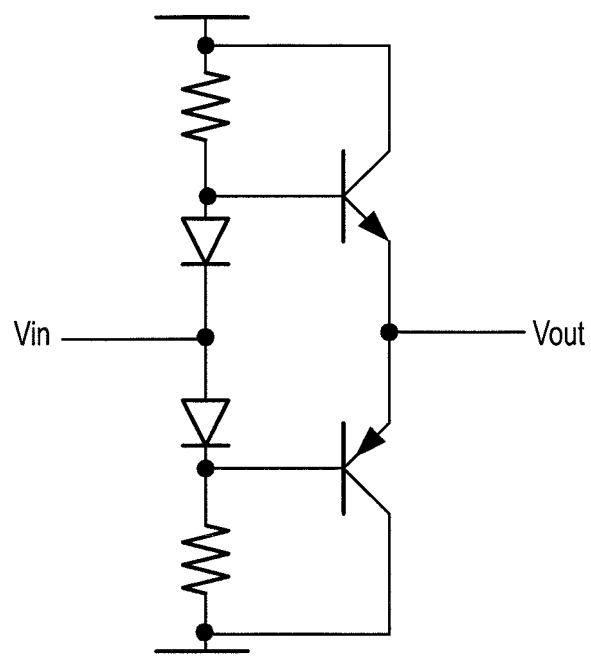
FIG. 10 depicts an exemplary power amplifier for use in various embodiments, such as those depicted in FIGS. 9a-9b in accordance with various embodiments.

Parameters may be selected to cancel only ESR 640 or EPC 660. Notably, in some embodiments, the circuitry for compensating for the additional ESR 640 and EPC 660 can be implemented outside of active feed forward circuit. Those skilled in the art will appreciate that the circuit diagrams shown herein are for examples and other substitute configurations can be used without departing from the spirit and scope of the invention, as appreciated by those skilled in the art. FIG. 10 depicts an exemplary power amplifier for use in various embodiments, such as those depicted in FIGS. 9a-9b.

Figure 11:
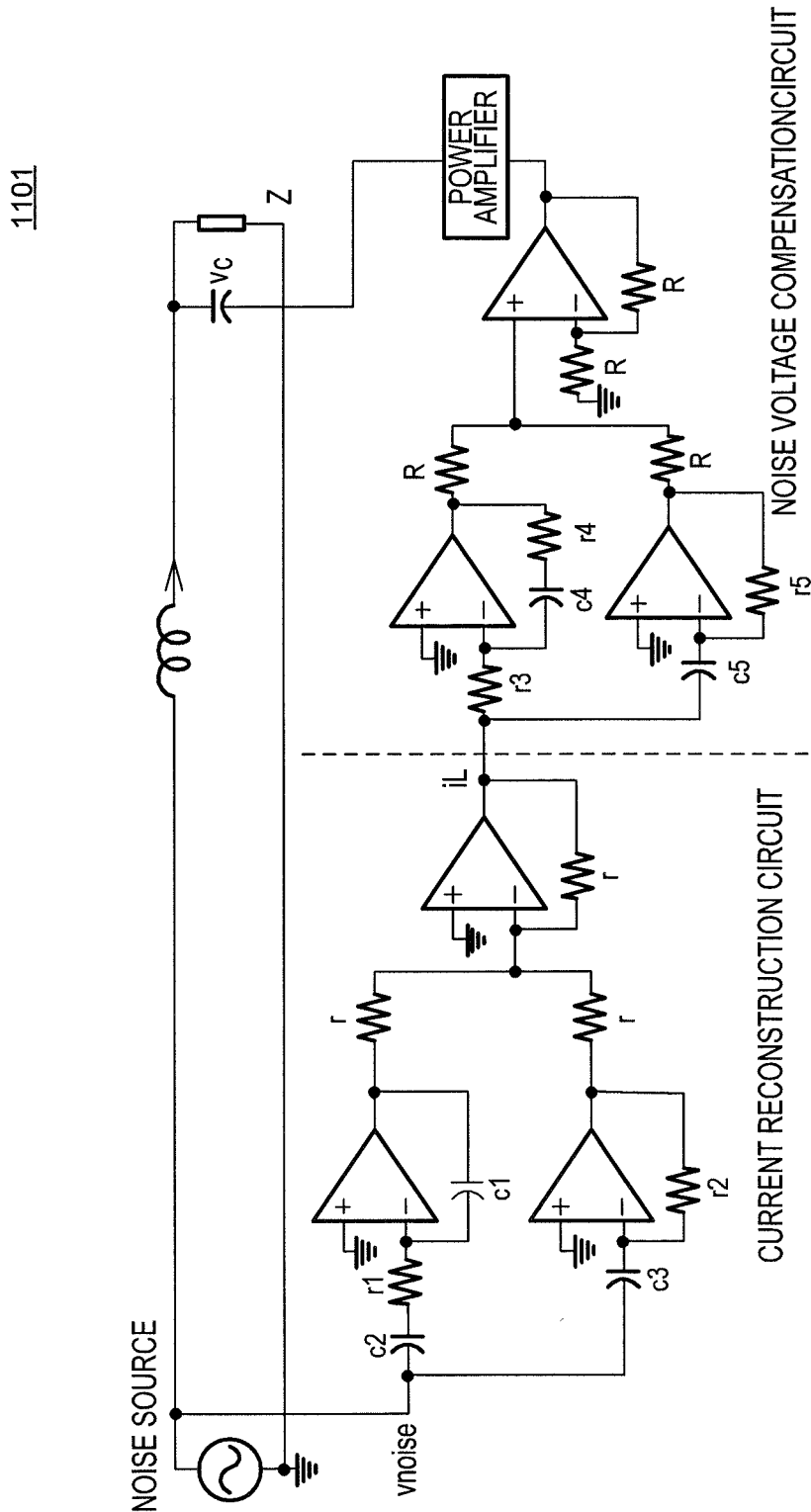
FIG. 11 depicts an exemplary active circuit comprising the current reconstruction circuit coupled to the compensation circuit in accordance with various embodiments.

Referring now to FIG. 11, there is shown a circuit diagram 1101 of another exemplary implementation of reconstruction circuit diagram shown in FIG. 7. Further, as shown, noise voltage compensation circuit, like compensation circuit of FIG. 9B, can account for additional ESR and ESL of a non-ideal filter capacitor (i.e., filter capacitor(s)). The compensation circuit comprising accounts for the additional non-ideal ESR and ESL via operational amplifiers coupled to respective resistors, capacitors, etc., as discussed above. Circuit 1101 does not include circuitry for notch filter and high pass filters; however, a notch filter and high pass filter can be operatively included as described herein.

Figure 12:
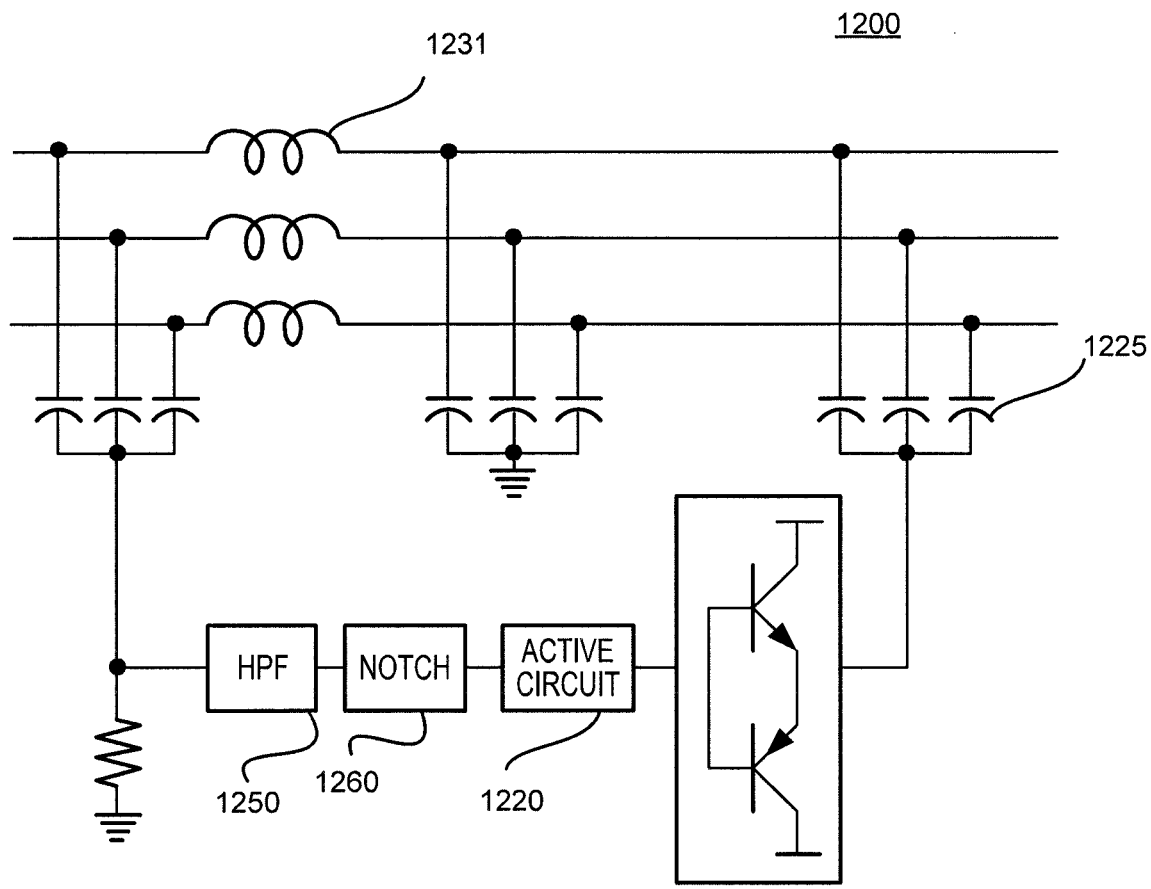
FIG. 12 depicts an exemplary three-phase application using filters in accordance with various embodiments.

With respect now to FIG. 12, an implementation of the active feed forward sensor is shown in accordance with a three phase noise source. As discussed above, EMI noise typically ranges from approximately 150 kHz to approximately 30 MHz. Typically, the switching frequency and lower harmonic components account for a substantial amount of voltage and current of the active feed forward sensor. Accordingly, one or more of high pass filters and/or notch filters can be used to reduce the overall voltage and current rating of the active feed forward sensor by eliminating noise component signals outside of the EMI noise band. For example, FIG. 12 shows an example circuit 1200 that implements such additional filters for a three-phase noise source (not shown). Notably, small size passive filters (shown as three capacitors located between inductors 1231 and filter capacitors 1225) can be implemented to attenuate high frequency EMI noise, which is beyond the active filter frequency band.

In operation, circuit 1200 comprises a noise detection circuit, an active feed forward circuit 1220 and a filter capacitor 1225. Active feed forward sensor is disposed between a noise source and a load. Additionally, as discussed above, one or more filters such as a high pass filter 1250 and notch filter 1260 receive the detected EMI noise signal from detection circuit and filter out noise signals outside of the EMI noise signal band. Once filtered, the EMI noise signal can be passed to active feed forward circuit. Active feed forward circuit receives the EMI noise signal and, based on the received EMI noise signal, generates a noise canceling signal. The noise canceling signal is passed onto one or more filter capacitors to cancel the EMI noise prior to load. A power amplifier (not shown), may amplify the noise canceling signal before it reaches the filter capacitors 1225.

Figure 13A:
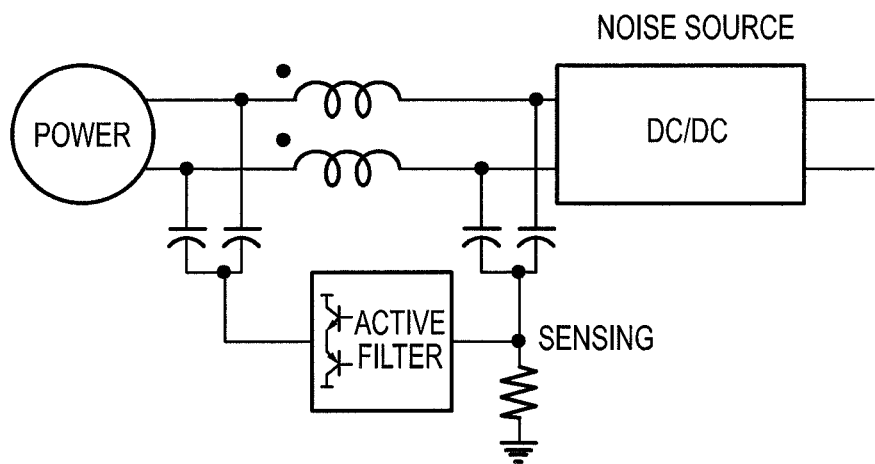
FIGS. 13a-13d depict AC/DC, DC/AC, DC/DC, and AC/AC power converter systems applying systems and concepts described herein in accordance with various embodiments.
Figure 13B:
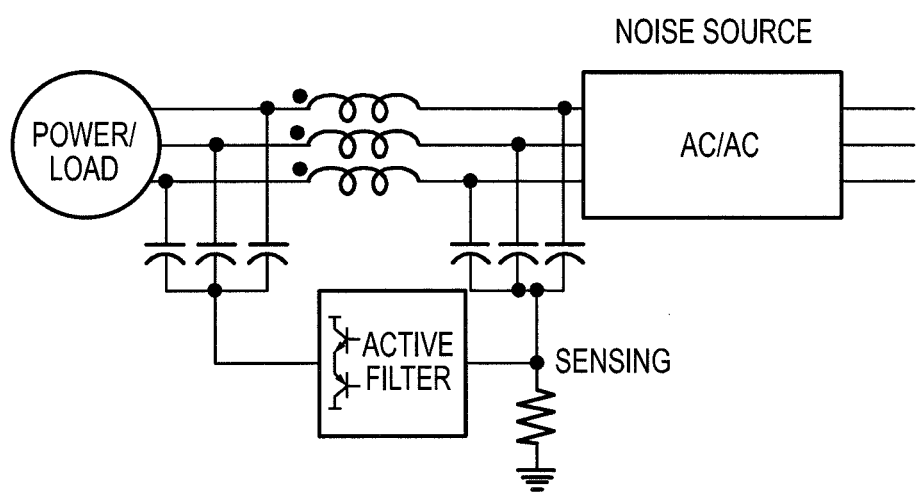
Figure 13C:
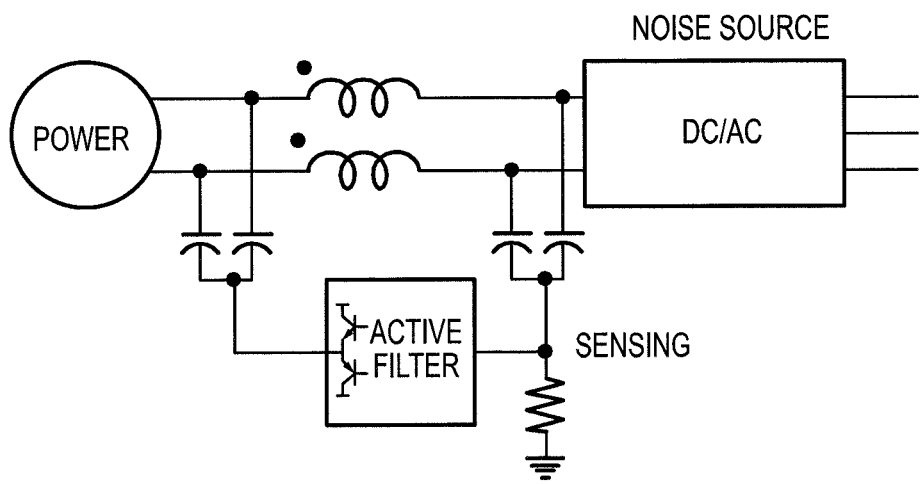
Figure 13D:
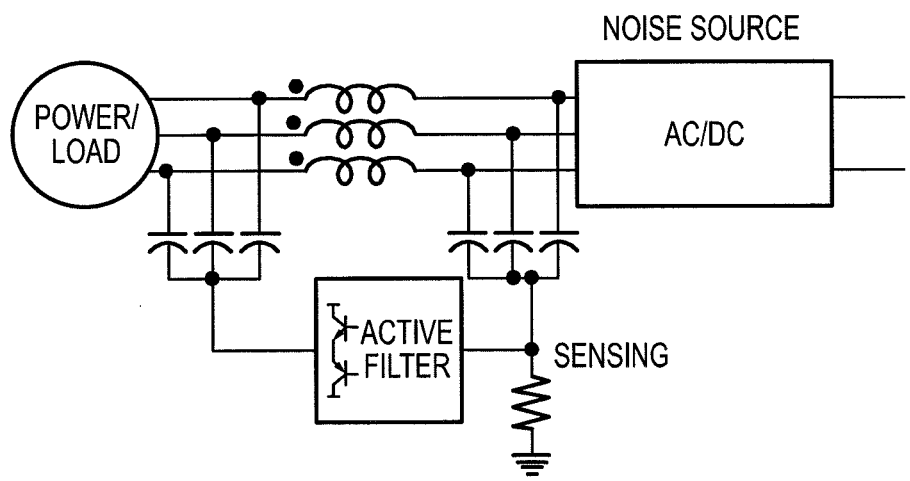

With reference now to FIGS. 13A-13D, collectively, various applications of an active feed forward sensor in accordance with a variety of noisy systems are shown. In particular, FIG. 13A shows the active feed forward sensor implementation for a DC/DC noise source, FIG. 13B shows the active feed forward sensor implementation for a AC/AC noise source, FIG. 13C shows the active feed forward sensor implementation for an DC/AC noise source, and FIG. 13D shows the active feed forward sensor implementation for an AC/DC noise source.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments. Different cross-hatching is used throughout the figures to denote different parts but not necessarily to denote the same or different materials.

Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An apparatus for active feed forward electromagnetic interference ("EMI") filtering, comprising:
   a noise voltage detection circuit configured to receive EMI noise occurring at a noise source;
   a current reconstruction circuit configured to reconstruct current associated with EMI noise occurring at a noise source;
   an active feed forward circuit operatively coupled to the noise detection circuit configured to generate a voltage noise compensation signal based on EMI noise received by the noise detection circuit; and
   a filter operatively coupled to the active feed forward circuit and the noise source, wherein the filter is configured to receive the EMI noise occurring at the noise source and the voltage noise compensation signal from the active feed forward circuit, wherein the filter is configured to cancel received EMI noise based on the received voltage noise compensation signal to reduce EMI noise at a load.

2. The apparatus as recited in claim 1, wherein the filter includes a capacitor configured to receive the EMI noise occurring at the noise source at a first terminal, and is configured to receive the voltage noise compensation signal from the active feed forward circuit at a second terminal opposed to the first terminal, wherein the capacitor is configured to maintain a substantially steady voltage to attenuate the received EMI noise received at the first terminal based on the received voltage noise compensation signal at the second terminal.

3. The apparatus as recited in claim 2, wherein the filter further includes an inductor operatively coupled in series between the noise source and the load, wherein the capacitor is operatively coupled in parallel to the noise source and the load and in series with the active feed forward circuit.

4. The apparatus as recited in claim 2, wherein the filter further includes at least one high pass filter and at least one notch filter configured to prevent the filter from substantially receiving additional signal noise outside an EMI noise frequency band from the noise source.

5. The apparatus as recited in claim 4, wherein the filter is configured and adapted to substantially eliminate EMI band noise substantially above about 150 kHz.

6. The apparatus as recited in claim 1, further comprising an amplifier operatively coupled between the active feed forward circuit and the filter configured to increase the voltage noise compensation signal generated by the active feed forward sensor to yield an amplified voltage noise compensation signal, wherein the voltage noise compensation signal received at the filter is the amplified voltage noise compensation signal.

7. The apparatus as recited in claim 6, wherein the amplifier includes one or more operational amplifiers.

8. The apparatus as recited in claim 1, wherein the voltage detection circuit is a voltage sensor.

9. The apparatus as recited in claim 8, wherein the voltage sensor is coupled in series to an output of the noise source.

10. A method for active electromagnetic interference ("EMI") filtering, comprising:
   determining, via a voltage noise detection circuit, EMI noise occurring at a noise source;
   reconstructing, via a current reconstruction circuit; current associated with EMI noise occurring at a noise source from the determined voltage from the voltage noise detection circuit;
   generating, via an active feed forward sensor operatively coupled to the noise detection circuit, a voltage noise compensation signal based on the determined EMI noise by the current reconstruction circuit;
   receiving, via a filter operatively coupled to the active feed forward sensor and the noise source, the EMI noise occurring at the noise source and the voltage noise compensation signal from active feed forward sensor; and
   canceling, via the filter, the received EMI noise based on the received voltage noise compensation signal to reduce EMI noise at a load.

11. The method as recited in claim 10, wherein the canceling, via the filter, the received EMI noise based on the received voltage noise compensation signal comprises:
   receiving the EMI noise occurring at the noise source at a first terminal of a filter capacitor;
   receiving the voltage noise canceling signal at a second terminal opposed to the first terminal of the filter capacitor; and
   maintaining a substantially steady voltage at the filter capacitor to attenuate the received EMI noise received at the first terminal based on the received voltage noise compensation signal at the second terminal.

12. The method as recited in claim 11, further comprising filtering low frequency noise outside an EMI noise frequency band, via at least one high pass filter, prior to canceling the received EMI noise.

13. The method as recited in claim 10, further comprising:
   amplifying the voltage noise compensation signal to yield an amplified voltage noise compensation signal,
   wherein the receiving the voltage noise compensation signal includes receiving the amplified voltage noise compensation signal, and
   wherein the canceling the received EMI noise based on the received voltage noise compensation signal includes canceling the received EMI noise based on the received amplified voltage noise compensation signal.

14. The method as recited in claim 10, wherein the voltage noise detection circuit comprises a voltage sensor.

* * * * *